United States Patent
Zhao et al.

(10) Patent No.: US 9,936,582 B2
(45) Date of Patent: Apr. 3, 2018

(54) INTEGRATED CIRCUIT ASSEMBLIES WITH MOLDING COMPOUND

(71) Applicant: INTEL CORPORATION, Santa Clara, CA (US)

(72) Inventors: Junfeng Zhao, Shanghai (CN); Saeed S. Shojaie, Folsom, CA (US); Cheng Yang, Shanghai (CN)

(73) Assignee: INTEL CORPORATION, Santa Clara, CA (US)

( * ) Notice: Subject to any disclaimer, the term of this patent is extended or adjusted under 35 U.S.C. 154(b) by 273 days.

(21) Appl. No.: 14/432,195

(22) PCT Filed: Apr. 30, 2014

(86) PCT No.: PCT/CN2014/076585
§ 371 (c)(1),
(2) Date: Mar. 27, 2015

(87) PCT Pub. No.: WO2015/165068
PCT Pub. Date: Nov. 5, 2015

(65) Prior Publication Data
US 2015/0359100 A1    Dec. 10, 2015

(51) Int. Cl.
| | |
|---|---|
| H05K 1/18 | (2006.01) |
| H05K 1/14 | (2006.01) |
| H05K 3/36 | (2006.01) |
| H01L 23/48 | (2006.01) |
| H01L 25/00 | (2006.01) |
| H05K 3/30 | (2006.01) |

(Continued)

(52) U.S. Cl.
CPC ............. *H05K 1/181* (2013.01); *H01L 23/48* (2013.01); *H01L 25/00* (2013.01);
(Continued)

(58) Field of Classification Search
CPC .......... H05K 1/181; H05K 1/14; H05K 3/303; H05K 3/368; H05K 2201/10287;
(Continued)

(56) References Cited

U.S. PATENT DOCUMENTS

| | | | |
|---|---|---|---|
| 5,157,475 | A | 10/1992 | Yamaguchi |
| 6,075,711 | A | 6/2000 | Brown et al. |

(Continued)

FOREIGN PATENT DOCUMENTS

| | | |
|---|---|---|
| CN | 101436590 A | 5/2009 |
| CN | 102623359 A | 8/2012 |

(Continued)

OTHER PUBLICATIONS

International Search Report and Written Opinion dated Feb. 4, 2015, issued in corresponding International Application No. PCT/CN2014/076585, filed Apr. 30, 2014, 13 pages.

(Continued)

*Primary Examiner* — Jenny L Wagner
*Assistant Examiner* — Michael P McFadden
(74) *Attorney, Agent, or Firm* — Schwabe, Williamson & Wyatt, P.C.

(57) ABSTRACT

Embodiments of integrated circuit (IC) assemblies and related techniques are disclosed herein. For example, in some embodiments, an IC assembly may include a first printed circuit board (PCB) having a first face and an opposing second face; a die electrically coupled to the first face of the first PCB; a second PCB having a first face and an opposing second face, wherein the second face of the second PCB is coupled to the first face of the first PCB via one or more solder joints; and a molding compound. The molding compound may be in contact with the first face of the first PCB and the second face of the second PCB. Other embodiments may be disclosed and/or claimed.

20 Claims, 16 Drawing Sheets

(51) Int. Cl.
*H01L 25/065* (2006.01)
*H01L 25/16* (2006.01)

(52) U.S. Cl.
CPC .......... *H01L 25/0652* (2013.01); *H01L 25/16* (2013.01); *H01L 25/162* (2013.01); *H05K 1/14* (2013.01); *H05K 3/303* (2013.01); *H05K 3/368* (2013.01); *H01L 25/0655* (2013.01); *H01L 25/0657* (2013.01); *H01L 2224/16225* (2013.01); *H01L 2924/15311* (2013.01); *H05K 2201/10287* (2013.01); *H05K 2201/10674* (2013.01); *H05K 2201/10734* (2013.01); *Y10T 29/49128* (2015.01); *Y10T 29/49131* (2015.01)

(58) Field of Classification Search
CPC .......... H05K 2201/10674; H05K 2201/10734; H01L 23/48; H01L 25/00; H01L 25/0652; H01L 25/16; H01L 25/162; H01L 25/0657; H01L 2224/18225; H01L 2924/15311; Y10T 29/49128; Y10T 29/04
USPC ........................................................ 361/783
See application file for complete search history.

(56) References Cited

U.S. PATENT DOCUMENTS

| | | | | |
|---|---|---|---|---|
| 7,737,565 | B2* | 6/2010 | Coffy | H01L 21/561 257/786 |
| 2010/0155966 | A1* | 6/2010 | Moden | H01L 21/485 257/783 |
| 2011/0051385 | A1* | 3/2011 | Koh | H01L 23/5387 361/783 |
| 2011/0116247 | A1* | 5/2011 | Kim | H01L 25/105 361/783 |
| 2011/0128712 | A1* | 6/2011 | Prest | G06F 1/1626 361/783 |
| 2013/0175686 | A1 | 7/2013 | Meyer et al. | |
| 2015/0084180 | A1 | 3/2015 | Seko et al. | |

FOREIGN PATENT DOCUMENTS

| | | |
|---|---|---|
| CN | 103426869 A | 12/2013 |
| JP | H03101195 A | 4/1991 |
| JP | 2002207986 A | 7/2002 |
| JP | 2004281939 A | 10/2004 |

OTHER PUBLICATIONS

Office Action dated Jun. 13, 2017 for Japanese Patent Application No. 2016-559925, 15 pages.
Office Action dated Sep. 18, 2017 for Korean Application No. 2016-7027143, 15 pages.
Office Action dated Jan. 16, 2018 for Japanese Patent Application No. 2016-559925, 9 pages.

* cited by examiner

INTEGRATED CIRCUIT ASSEMBLIES WITH MOLDING COMPOUND

CROSS REFERENCE TO RELATED APPLICATIONS

The present application is a national phase entry under 35 U.S.C. § 371 of International Application No. PCT/CN2014/076585, filed Apr. 30, 2014, entitled "INTEGRATED CIRCUIT ASSEMBLIES WITH MOLDING COMPOUND," which designates, among the various States, the United States of America. The entire content and disclosure of International Application No. PCT/CN2014/076585 is hereby incorporated by reference in its entirety for all purposes.

TECHNICAL FIELD

The present disclosure relates generally to the field of integrated circuits (ICs), and more particularly, to IC assemblies with molding compound.

BACKGROUND

In existing integrated circuit (IC) devices, printed circuit boards (PCBs) and IC packages may be stacked using conventional connectors and package-on-package techniques. These techniques may be limited in how small of a form factor they can achieve, and thus may not be adequate for small, powerful next-generation devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
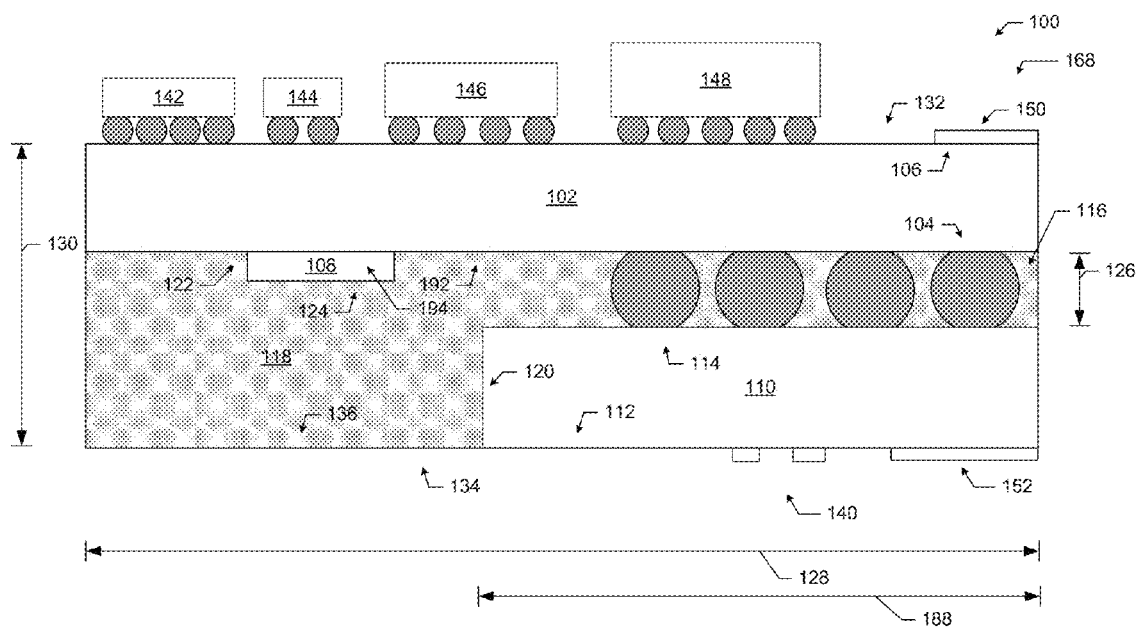
FIG. 1 is a side cross-sectional view of an IC assembly, in accordance with various embodiments.

Embodiments of integrated circuit (IC) assemblies and related techniques are disclosed herein. In some embodiments, an IC assembly may include a first printed circuit board (PCB) having a first face and an opposing second face; a die electrically coupled to the first face of the first PCB; a second PCB having a first face and an opposing second face, wherein the second face of the second PCB is coupled to the first face of the first PCB via one or more solder joints; and a molding compound. The molding compound may be in contact with the first face of the first PCB and the second face of the second PCB. In some such embodiments, the molding compound may contact the die; in other such embodiments, the molding compound may not contact the die. In some embodiments, an IC assembly may include a PCB having a first face and an opposing second face; a die electrically coupled to the first face of the PCB; a molding compound having a first face and an opposing second face, wherein the second face of the molding compound is in contact with the first face of the PCB and the die is contacted by the molding compound; and one or more through mold solder joints, extending from the first face of the PCB, through the molding compound, and beyond the second face of the molding compound.

The IC assemblies and techniques disclosed herein may enable miniaturization of existing IC devices, reducing the form factors of these devices. Reducing the size of devices may enable new applications for these devices (e.g., in wearable applications for other applications in which the available area is constrained). Additionally, providing more computing power in a smaller form may enable improved performance for devices whose size remains fixed.

For example, the IC assemblies and techniques disclosed herein may be used to provide a solid state memory drive smaller than any conventional drive of equivalent capacity. These drives may be included in smaller next-generation platforms, such as ultrabooks, tablets, and laptop-tablet hybrids. Some embodiments of the IC assemblies disclosed herein may provide solid state drive with a high level of component integration. For example, an IC assembly may include an application specific integrated circuit (ASIC), memory (e.g., a NAND die or package), passive components, and power management circuitry. By contrast, existing solid state drives may have certain components (e.g., the power system) in a separate assembly (e.g., on a motherboard).

The form factor of the solid state drives disclosed herein may meet or exceed next-generation targets. For example, various embodiments of the IC assemblies disclosed herein may provide solid state drives meeting the specifications for the 22 millimeter by 42 millimeter M.2 Card Format. In another example, various embodiments of the IC assemblies disclosed herein may provide solid state drives meeting the specifications for the 22 millimeter by 30 millimeter M.2 Card Format. Some embodiments of solid state drives formed in accordance with the IC assemblies and techniques disclosed herein may be slimmer in all three dimensions than existing drives.

The IC assemblies disclosed herein may have any of a number of advantages. For example, in some embodiments, an IC assembly may include an post-dicing die disposed on one face of a PCB (and may or may not be contacted by a molding compound), while IC packages may be surface mounted to the other face of the PCB. By coupling the die to one face of the PCB, more room may be left on the other face of the PCB for surface mounting IC packages.

Conventional technologies may not be able to achieve these reduced form factors. For example, some conventional designs surface mount an ASIC package, a NAND die or package, power modules, and passive components on a single-sided PCB. Conventional PCB technologies cannot enable the coupling of high input/output (I/O) post-dicing dies into PCBs in a cost-effective manner. In particular, conventional die embedding methods may fail to achieve sufficient yield for high I/O dies. Various embodiments of the IC assemblies disclosed herein may have a face provided by a PCB. Any suitable discrete top components may be mounted on the PCB face (e.g., to form a system-in-package). Unlike conventional technologies, these top components may not be subject to any particular coupling requirements (e.g., for bailout or pinout). The ease of access to such components (and the ability to remove and/or replace these components) may enable high final assembly and test yields compared to some traditional system-in-package approaches (in which all packages are encapsulated). Additionally, as the requirements for electronic products change, surface-mounted components may be readily swapped in the manufacturing process, improving design flexibility.

Embodiments of the IC assemblies disclosed herein may include both an ASIC and a non-volatile memory device (e.g., flash memory). In some embodiments, the ASIC and the non-volatile memory device may be separated in the IC assembly, reducing the likelihood of thermal damage to the temperature sensitive non-volatile memory from the ASIC (which may be a major heat dissipating component).

FIG. 1 is a side cross-sectional view of an IC assembly 100, in accordance with various embodiments. The IC assembly 100 may include a first printed circuit board (PCB) 102, a die 108, a second PCB 110, and a molding compound 118. The functionality of the IC assembly 100 may be determined by the circuitry included in or disposed on the components of the IC assembly 100. For example, in some embodiments, the IC assembly 100 may include components arranged to form a solid state drive. Any other suitable functionality may be provided by the IC assembly 100 by appropriate selection and arrangement of the components of the IC assembly 100.

The first PCB 102 may have a first face 104 and a second face 106 opposite to the first face 104. The first PCB 102 may be formed from any conventional PCB materials (e.g., laminates and copper) and may have any desired number of layers. In some embodiments, the first PCB 102 may be a four layer PCB. The first PCB 102 may include conductive contacts formed on the first face 104 and/or the second face 106, and vias between the first face 104 and the second face 106, to couple electrical signals along and between the faces 104 and 106. Examples of conductive contacts may include traces, pads, fingers or any suitable conductive interconnect component. The form of a conductive contact may vary depending upon the application. For example, in some embodiments, traces may be used to route signals, fingers may be exposed for wire bonding or mating with a socket, and pads may be used for surface mounting, probe contact, or test.

The die 108 may include a first face 124, a second face 194, and side faces 122. As shown, the second face 194 may be proximate to the first face 104 of the first PCB 102. In some embodiments, the die 108 may be electrically coupled to the first face 104 of the first PCB 102. For example, in some embodiments, the die 108 may be wire bonded to the first face 104 of the first PCB 102. Wires included in the wire bonds may extend from the first face 124, the side faces 122, or the second face 194 of the die 108. Electrical signals transmitted through the electrical coupling between the die 108 and the first face 104 may be further transmitted through the first PCB 102 and to/from other components electrically coupled to the first face 104 and/or the second face 106.

Examples of such components are discussed below. In some embodiments, the die 108 may be mechanically coupled to the first face 104 of the first PCB 102 (e.g., via an adhesive and/or an electrical coupling mechanism, such as wire bonding or soldering). In some embodiments, the die 108 may be attached using a flip chip process. Although only a single die 108 is illustrated in FIG. 1, multiple dies may be mounted to the first face 104 of the first PCB 102.

The die 108 may include a silicon or other semiconductor material, and a plurality of devices configured to perform a desired function. The devices included in the die 108 may be any suitable type of electronic device (e.g., discrete or integrated devices, transistor-based devices, etc.). For example, in some embodiments, the die 108 may be an application specific integrated circuit (ASIC). The ASIC may serve any of a number of functions, depending upon the application. For example, in some embodiments in which the IC assembly 100 is a solid state drive, an ASIC may serve as a controller that manages and interfaces the external data bus (e.g., Serial ATA and Peripheral Component Interface signals) and internal memory that stores data. The die 108 may include a single piece of silicon or multiple pieces of silicon, and may include any suitable type of electronic components. In various embodiments, any electronic device may be used as the die 108. Additionally, although the die 108 may be referred to in the singular herein, multiple dies 108 (e.g., of varying sizes, types and functions) may be included in the IC assembly 100.

In some embodiments, the die 108 may not have undergone substantially more processing than being cut from a semiconductor wafer on which electrical devices have been constructed. For example, the die 108 may be one of many dies formed in an array on a silicon wafer, and may not have been more substantially processed than being separated from the other dies in the array in a dicing process. Such dies may be referred to herein as "post-dicing dies." Since a post-dicing die 108 may be much thinner than a die that has undergone additional packaging steps (e.g., the addition of outer protective components) that performs the same function, the use of a post-dicing die 108 in the IC assembly 100 may enable the IC assembly 100 to achieve a reduced thickness 130 relative to the use of a further packaged die. For example, in some embodiments, a post-dicing die may be tens of microns thick, while further packaged dies may be hundreds of microns thick.

The second PCB 110 may also be coupled to the first face 104 of the first PCB 102. In particular, the second PCB 110 may have a first face 112 and an opposing second face 114, and the second face 114 may be coupled to the first face 104 of the first PCB 102. In some embodiments, the second face 114 of the second PCB 110 may be coupled to the first face 104 of the first PCB 102 via one or more solder joints 116. In some embodiments, the solder joints 116 may be through mold solder joints, and may be embedded in or through the molding compound 118. The second PCB 110 may be formed from any conventional PCB materials and may have any desired number of layers. In some embodiments, the second PCB 110 may be a two layer PCB. The second PCB 110 may include conductive contacts formed on the first face 112 and/or the second face 114, and vias between the first face 112 and the second face 114 to couple electrical signals along and between the faces. For example, conductive contacts formed on the second face 114 may be in contact with the solder joints 116, the second PCB 110 may include vias between these conductive contacts and conductive contacts on the first face 112, and these vias may couple electrical signals from the first PCB 102, via the solder joints 116, to the first face 112. In some embodiments, electrical signals may be transmitted between the die 108 and the first face 112 of the second PCB 110 along such pathways. In some embodiments, intermediate structures or devices (not shown) may be disposed between the first PCB 102 and the second PCB 110. The second face 114 of the second PCB 110 and the first face 104 of the first PCB 102 may be separated by a distance 126. In some embodiments, the distance 126 may be less than one millimeter. In some embodiments, flip chip components, passive components, or other components may be mounted to the first face 104 of the first PCB 102 via one or more solder joints (formed as described above with reference to the solder joints 116), in addition to or instead of the second PCB 110.

The first PCB 102 may have a length 128 and the second PCB 110 may have a length 188. The lengths 128 and 188 may take any desired values sufficient to accommodate the components desired in the IC assembly 100. In some embodiments, the length 128 may be greater than the length 188. In some embodiments, the length 128 may be approximately equal to the length 188. In some embodiments, the length 128 may be less than the length 188. In some embodiments, the length 128 of the first PCB 102 may be approximately 42 millimeters. In some embodiments, the length 128 of the first PCB 102 may be approximately 30 millimeters. In some embodiments, the length 188 of the second PCB 110 may be approximately 12 millimeters.

The die 108 may be arranged relative to the first face 104 of the first PCB 102 and the second face 114 of the second PCB 110 in any of a number of ways. For example, in some embodiments, the die 108 may be arranged so as to be disposed between the second face 114 of the second PCB 110 and the first face 104 of the first PCB 102. In some embodiments, the die 108 may not be disposed between the second face 114 of the second PCB 110 and the first face 104 of the first PCB 102 (e.g., as illustrated in FIG. 1). In some embodiments, the die 108 may be partially disposed between the second face 114 of the second PCB 110 and the first face 104 of the first PCB 102.

The molding compound 118 may have a first face 136 and a second face 192. In the embodiment of FIG. 1, the molding compound 118 is illustrated as contacting the die 108. In some embodiments, the molding compound 118 may at least partially cover the die 108. For example, in some embodiments, the molding compound 118 may be in contact with and cover the side faces 122 of the die 108. As used herein, the phrase "covering" a face or object may refer to contacting substantially all portions of the face or object not contacted or covered by other components. In some embodiments, the molding compound 118 may be in contact with and cover the side faces 122, and may be in contact with the first face 124. In some embodiments, the molding compound 118 may cover the first face 124. In some embodiments in which there is a "gap" between the second face 194 of the die 108 and the first face 104 of the first PCB 102, the molding compound 118 may contact the second face 194. In some embodiments, the molding compound 118 may cover the side faces 122 and the first face 124 of the die 108. In some embodiments, the molding compound 118 may cover the die 108. In some embodiments, the first face 136 of the molding compound 118 may be spaced away from the first face 124 of the die 108 (e.g., by an intervening portion of the molding compound 118, as shown). In some embodiments, the second face 192 of the molding compound 118 may be substantially co-planar with the second face 194 of the die 108.

The molding compound 118 (e.g., the second face 192 of the molding compound 118) may be in contact with the first face 104 of the first PCB 102, and in contact with the second face 114 of the second PCB 110. In some embodiments, the molding compound 118 may cover the first face 104 of the first PCB 102. In some embodiments, the molding compound 118 may cover the second face 114 of the second PCB 110. In some embodiments, the molding compound 118 may cover the solder joints 116. As noted above, in some embodiments, the molding compound 118 may not contact the die 108. Some examples of such embodiments are discussed below with reference to FIG. 24.

Any suitable molding compound may be used as the molding compound 118. For example, an encapsulating epoxy plastic material, resin, or any suitable molding compound typically used in packaging applications, may be used. Any of these materials may or may not include fillers or other particles, such as silica fillers. The molding compound 118 may be formed by any suitable process, such as the molding processes discussed below and illustrated with reference to FIGS. 7-10.

The IC assembly 100 may have a first face 134 and a second face 132. In some embodiments, the first face 134 may include at least a portion of the first face 112 of the second PCB 110. In some embodiments, the first face 134 may include at least a portion of the first face 136 of the molding compound 118. In some embodiments, the first face 134 may include at least a portion of the first face 112 of the second PCB 110 and at least a portion of the first face 136 of the molding compound 118 (e.g., as shown in FIG. 1). In particular, the first face 112 of the second PCB 110 may be substantially co-planar with the first face 136 of the molding compound 118. In some embodiments, the first face 134 may be substantially entirely provided by the first face 136 of the molding compound 118. In other embodiments, the first face 134 may be substantially entirely provided by the first face 112 of the second PCB 110. In some embodiments, the first face 134 may be spaced away from the first face 136 of the molding compound 118 and/or the first face 112 of the second PCB 110. In some such embodiments, additional components may be disposed between the first face 134 and the first face 136 of the molding compound 118 and/or between the first face 134 and the first face 112 of the second PCB 110. For example, additional PCBs may be disposed between the first face 136 of the molding compound 118 and the first face 134, and/or between the first face 112 of the second PCB 110 and the first face 134. The additional PCBs may take the form of any of the PCBs discussed herein. For example, the IC assembly 100 may include more than two PCBs, and these PCBs may be coupled to each other in any desired arrangement using solder joints similar to the solder joints 116. In some embodiments, the IC assembly 100 may include three or more PCBs.

In some embodiments, the second face 132 may include at least a portion of the second face 106 of the first PCB 102. In some embodiments, the second face 132 may be substantially entirely provided by the second face 106 of the first PCB 102 (e.g., as shown in FIG. 1). In some embodiments, the second face 132 may include at least a portion of the second face 192 of the molding compound 118 (not shown). In some embodiments, the second face 132 may be spaced away from the second face 106 of the first PCB 102. In some such embodiments, additional components may be disposed between the second face 106 of the first PCB 102 and the second face 132. For example, additional PCBs may be disposed between the first PCB 102 and the second face 132

(e.g., in accordance with any of the embodiments discussed above with reference to the first face 134).

In any of the foregoing embodiments, the first face 134 and/or the second face 132 may have a protective coating (e.g., a plastic coating, not shown) disposed thereon. Such coatings may be conventional, and are not discussed further herein.

In some embodiments, the IC assembly 100 may include additional components. For example, the IC assembly 100 may include one or more probe pads 140. The probe pads 140 may be disposed on the first face 134 of the IC assembly 100 (e.g., on the first face 112 of the second PCB 110, as shown in FIG. 1). In some embodiments, probe pads may be disposed on the second face 132 of the IC assembly 100 (e.g., on the second face 106 of the first PCB 102). Each of the probe pads 140 may be a conductive region (e.g., a flat portion of metal) that is electrically coupled to one or more other components in the IC assembly 100. In some embodiments, the probe pads 140 may be used to provide contact point by which to test various components internal to the IC assembly 100 (e.g., various circuitry included in the die 108, or disposed on the second PCB 110 or the first PCB 102). Example tests may include the detection of open/short circuits, and/or evaluation of the performance of various components.

The IC assembly 100 may include one or more IC packages surface mounted to the second face 106 of the first PCB 102 and/or to the first face 112 of the second PCB 110. In FIG. 1, the IC packages 142-148 are illustrated as surface mounted to the second face 106 of the first PCB 102. In the illustrated embodiment, the second face 106 of the first PCB 102 coincides with the second face 132 of the IC assembly 100. Any desired IC package may be surface mounted to one or more of the PCBs 102 and 110 included in the IC assembly 100. For example, the IC package 142 may be a temperature sensor. The IC package 144 may include one or more passive components, such as resistors and capacitors. The IC package 146 may be a power management integrated circuit (PMIC). The IC package 148 may be a memory device, such as a flash memory. In some embodiments, the IC package 148 may be a NAND flash memory having a ball grid array (BGA) for surface mounting to the second face 132 of the IC assembly 100. In some embodiments, one or more of the IC packages 142-148 may not be surface mounted to the second face 106 of the first PCB 102, but may instead be coupled (e.g., in a post-dicing form) to the first face 104 as discussed above with reference to the die 108. In particular, in some embodiments, the IC package 144, 146 and/or 148 may be so coupled. Other devices may be surface mounted to the IC assembly 100 (e.g., one or more crystals). In some embodiments, IC packages may be disposed on the second face 132 of the IC assembly 100, and no IC packages may be disposed on the first face 134 of the IC assembly 100.

As illustrated in FIG. 1, the IC packages 142-148 (surface mounted to the second face 132 of the IC assembly 100) may not be covered by the molding compound 118. In particular, in some embodiments, any IC packages included on the first face 134 or the second face 132 of the IC assembly 100 (e.g., the IC packages 142-148) may be surface mounted to the second face 132 after the molding compound 118 is provided to the IC assembly 100. Because such packages are not embedded in molding compound, the packages may be readily mounted, replaced, or removed during the lifetime of the IC assembly 100.

The first face 134 and/or the second face 132 of the IC assembly 100 may include one or more conductive contacts that may be used to enable electrical coupling between the circuitry of the IC assembly 100 and an external socket or other coupling component. For example, as shown in FIG. 1, one or more conductive contacts 150 may be disposed on the second face 132 of the IC assembly 100 (e.g., on the second face 106 of the first PCB 102). One or more conductive contacts 152 may be disposed on the first face 134 of the IC assembly 100 (e.g., on the first face 112 of the second PCB 110). In some embodiments, the conductive contacts 150 may be printed on the first PCB 102 prior to coupling the die 108 to the first face 104 of the first PCB 102. In some embodiments, the conductive contacts 150 and/or 152 may be printed on the first PCB 102 and/or the second PCB 110, respectively, before the first PCB 102 and the second PCB 110 are coupled via the one or more solder joints 116. In some embodiments, the conductive contacts 150 and/or 152 may be printed on the first PCB 102 and/or the second PCB 110, respectively, before the molding compound is provided to the IC assembly 100.

The conductive contacts 150 and/or 152 may be disposed at any desired location on a face of the IC assembly 100. In some embodiments, the conductive contacts 150 and/or 152 may be disposed proximate to an end of the IC assembly 100 (e.g., as shown in FIG. 1). In particular, the conductive contacts 150 and/or 152 may be part of an edge finger connector, which may be received by a complementary socket in an external device and used to electrically and mechanically couple the IC assembly 100 to the external device. Various examples of such embodiments are discussed below with reference to FIGS. 2 and 3.

Figure 2:
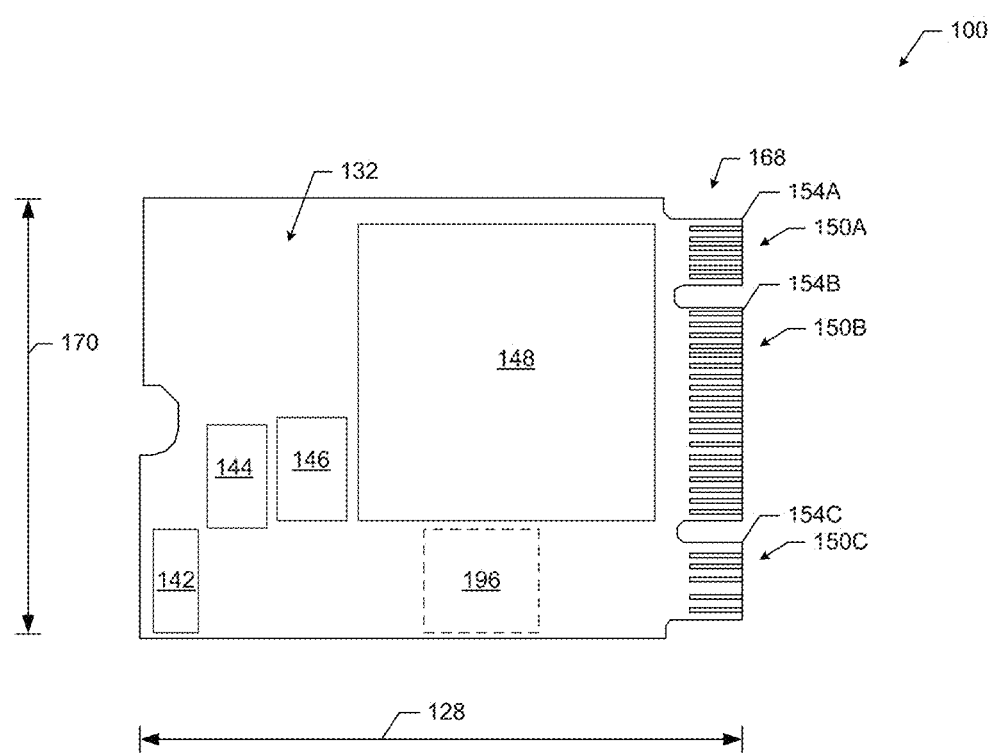
FIGS. 2 and 3 are top and bottom views, respectively, of an embodiment of the IC assembly of FIG. 1.
Figure 3:
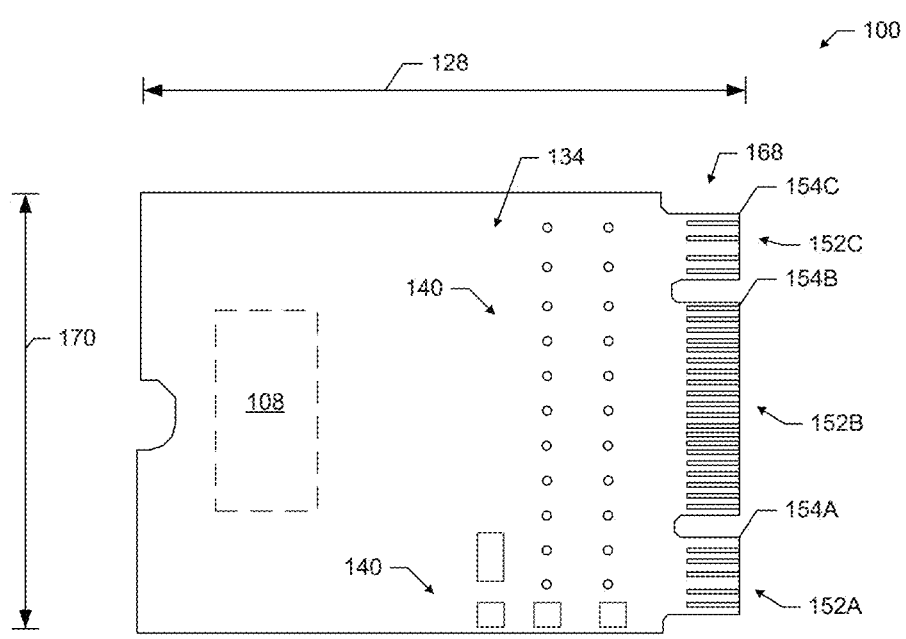

FIGS. 2 and 3 are top and bottom views, respectively, of an embodiment of the IC assembly 100. In particular, FIGS. 2 and 3 illustrate an embodiment in which the IC assembly 100 includes an edge finger connector 168 for mechanically and electrically coupling with a socket of an external device, as discussed above. A number of embodiments of the edge finger connector 168 are illustrated in FIGS. 2 and 3, and discussed below. Other features of the embodiments of FIGS. 2 and 3, discussed below, may be included in the IC assembly 100, whether or not the IC assembly 100 includes an edge finger connector 168.

FIG. 2 is a top view of an embodiment of the IC assembly 100. In particular, FIG. 2 illustrates the second face 132 of the IC assembly 100, in accordance with some embodiments. The IC assembly 100 may have a length 128 (e.g., as discussed above with reference to FIG. 1) and a width 170. In some embodiments, the length 128 may be equal to the length of the PCB 102. In some embodiments, the width 170 may be equal to the width of the PCB 102. The width 170 may take any desired value sufficient to accommodate the components desired in the IC assembly 100. For example, in some embodiments, the width 170 may be approximately 22 millimeters.

As discussed above with reference to FIG. 1, one or more IC packages may be disposed on the second face 132. For example, in FIG. 2, the temperature sensor 142, the passive components 144, the PMIC 146, and a memory device 148 are shown as disposed on the second face 132. The arrangement of the IC packages 142-148 in FIG. 2 is simply illustrative, and any desired arrangement may be used. For example, in some embodiments, the temperature sensor 142 may be disposed in the area 196, laterally aligned with the memory device 148 in the direction of the width 170 of the IC assembly 100.

The edge finger connector 168 may include three projections 154A, 154B, and 154C. Each of the projections 154A, 154B, and 154C may include one or more conductive contacts 150 (i.e., the conductive contacts 150A, 150B, and 150C, respectively). For example, in some embodiments, the conductive contacts 150A may include six conductive contacts, the conductive contacts 150B may include nineteen conductive contacts, and the conductive contacts 150C may include five conductive contacts. In some embodiments, the conductive contacts 150 may be gold contacts, and may be printed on the second face 106 of the first PCB 102. The number and geometry of projections in the edge finger connector 168 (if any) and the number, distribution, and geometry of the conductive contacts 150 may be selected to enable a mating between the edge finger connector 168 and a desired socket.

FIG. 3 is a bottom view of an embodiment of the IC assembly 100. In particular, FIG. 3 illustrates the first face 134 of the IC assembly 100, in accordance with some embodiments. The IC assembly 100 may have a length 128 and a width 170 (e.g., as discussed above with reference to FIGS. 1 and 2). FIG. 3 also illustrates an example of the relative positioning of the die 108 in the IC assembly 100. As discussed above, the die 108 may be covered by the molding compound 118.

As discussed above with reference to FIG. 1, one or more probe pads 140 may be disposed on the first face 134. As illustrated in FIG. 3, the probe pads 140 may take any of a number of different sizes and shapes, and may be arranged as desired. In some embodiments, the probe pads 140 may be printed on the first face 112 of the second PCB 110. The second PCB 110 may also include conductive vias between the probe pads 140 and the second face 114 of the second PCB 110. Signals may be transmitted between the probe pads 140 and other circuitry of the IC assembly 100 through these conductive vias. In some embodiments, the probe pads 140 may be formed from a metal material (e.g., copper) and covered with another metal (e.g., gold, tin, palladium or silver) or an organic thin film to prevent oxidation.

As discussed with reference to FIG. 2, the edge finger connector 168 may include three projections 154A, 154B, and 154C. Each of the projections 154A, 154B, and 154C may include one or more conductive contacts 152 (i.e., the conductive contacts 152A, 152B, and 152C, respectively). For example, in some embodiments, the conductive contacts 152A may include five conductive contacts, the conductive contacts 152B may include twenty conductive contacts, and the conductive contacts 152C may include four conductive contacts. In some embodiments, the conductive contacts 152 may be gold contacts, and may be printed on the first face 112 of the second PCB 110. The number and geometry of projections in the edge finger connector 168 (if any) and the number, distribution, and geometry of the conductive contacts 152 may be selected to enable a mating between the edge finger connector 168 and a desired socket.

As noted above, the dimensions of the IC assembly 100 may take any desired values. For example, in some embodiments, the width of the IC assembly 100 may be 12, 16, 22 or 30 millimeters. In some embodiments, the length of the IC assembly 100 may be 16, 26, 30, 38, 42, 60, 80 or 110 millimeters. These dimensions are simply illustrative, and any desired dimensions may be used.

FIGS. 4-11 illustrate side, cross-sectional views of various assemblies subsequent to various operations in the manufacture of an IC assembly, in accordance with various embodiments. For ease of illustration, the assemblies depicted in FIGS. 4-11 may represent various stages in the manufacture of the IC assembly 100, but the operations discussed with reference to FIGS. 4-11 may be used to manufacture any suitable IC assembly. In various embodiments, one or more of these operations may be omitted, repeated, or performed in an alternate order, as suitable.

Additionally, FIGS. 4-11 depict operations performed with reference to a single IC assembly 100, but this is simply for ease of illustration. In some embodiments, a number of IC assemblies 100 may be formed in parallel (e.g., tens of assemblies). For example, multiple IC assemblies 100 may be formed in an array, and the operations discussed with reference to FIGS. 4-11 may be performed on the array simultaneously or in any suitable order. After an array of the IC assemblies 100 are formed, the array may be cut into pieces (not illustrated in FIGS. 4-11) to segment the IC assemblies 100 from each other. Manufacturing the IC assembly 100 in batches may improve throughput.

Figure 4:
FIGS. 4-11 illustrate side, cross-sectional views of various assemblies subsequent to various operations in the manufacture of an IC assembly as illustrated in FIG. 1, in accordance with various embodiments.

FIG. 4 depicts an assembly 400 subsequent to forming a conductive contact 150 on the second face 106 of the first PCB 102. One or more conductive contacts 150 may be formed on the second face 106. In some embodiments, the conductive contact 150 may be printed on the second face 106 using conventional PCB patterning techniques. In some embodiments, the conductive contacts 150 may be pads for surface mounting. The first PCB 102 may include additional conductive contacts on the second face 106 and/or on the first face 104, arranged to couple with components to be attached at subsequent operations. As discussed above, the first PCB 102 may also include conductive vias between the first face 104 and the second face 106 to couple electrical signals between the faces. The arrangement of these contacts and vias may be planned in accordance with the arrangement of the additional components that will be included in the IC assembly 100, using conventional PCB design techniques.

Figure 5:
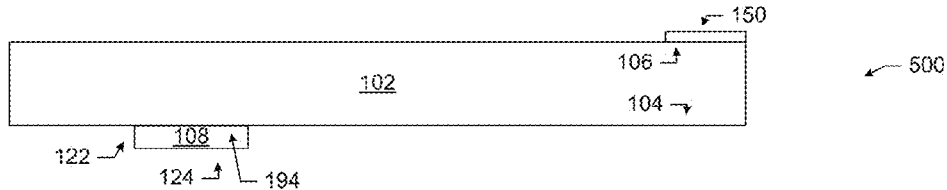

FIG. 5 depicts an assembly 500 subsequent to coupling the die 108 to the first face 104 of the first PCB 102 of the assembly 400. In particular, the second face 194 of the die 108 may be disposed proximate to the first face 104 of the first PCB 102. As discussed above with reference to FIG. 1, the coupling between the die 108 and the first PCB 102 may take any of a number of forms. For example, in some embodiments, the die 108 may be wire bonded to the first PCB 102. In some embodiments, the die 108 (e.g., a silicon die or any other electronic device) may be attached using a flip chip technology.

Figure 6:
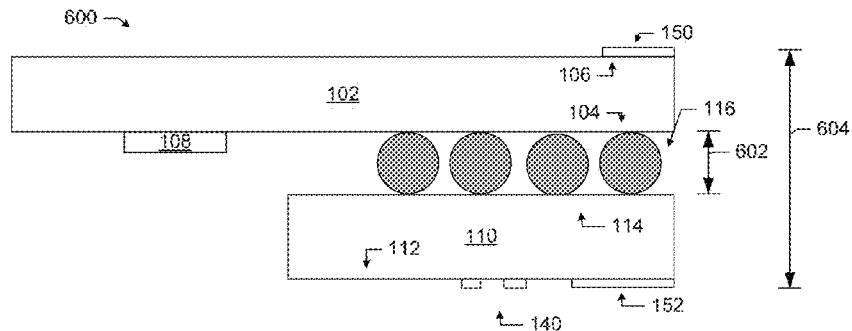

FIG. 6 depicts an assembly 600 subsequent to coupling the second PCB 110 to the first PCB 102 of the assembly 500. The coupling of the second PCB 110 to the first PCB 102 may be accomplished using a BGA ball mount process. In particular, the second face 114 of the second PCB 110 may be coupled to the first face 104 of the first PCB 102 via one or more solder joints 116. Upon coupling the second PCB 110 to the first PCB 102, the solder joints 116 may have a thickness 602, representing a distance between the first face 104 of the first PCB 102 and the second face 114 of the second PCB 110. The assembly 600 may have a thickness 604. In some embodiments, the second PCB 110 may have one or more probe pads 140 and/or one or more conductive contacts 152 disposed on the first face 112. The probe pads 140 and conductive contacts 152 may be printed on the second PCB 110 prior to coupling the second PCB 110 to the first PCB 102. The probe pads 140 and the conductive contacts 152 may be patterned using conventional PCB fabrication techniques.

The second PCB 110 may include additional conductive contacts on the first face 112 and/or on the second face 114, arranged to electrically couple with the die 108, the first PCB 102, and/or components to be attached at subsequent operations. For example, the second face 114 of the second PCB 110 and the first face 104 of the first PCB 102 may include conductive contacts arranged to contact the solder joints 116 so as to provide conductive pathways between the first PCB 102 and the second PCB 110. As discussed above, the second PCB 110 may also include conductive vias between the first face 112 and the second face 114 to couple electrical signals between the faces. The arrangement of these contacts and vias may be planned in accordance with the arrangement of the additional components that will be included in the IC assembly 100, using conventional PCB design techniques.

Figure 7:
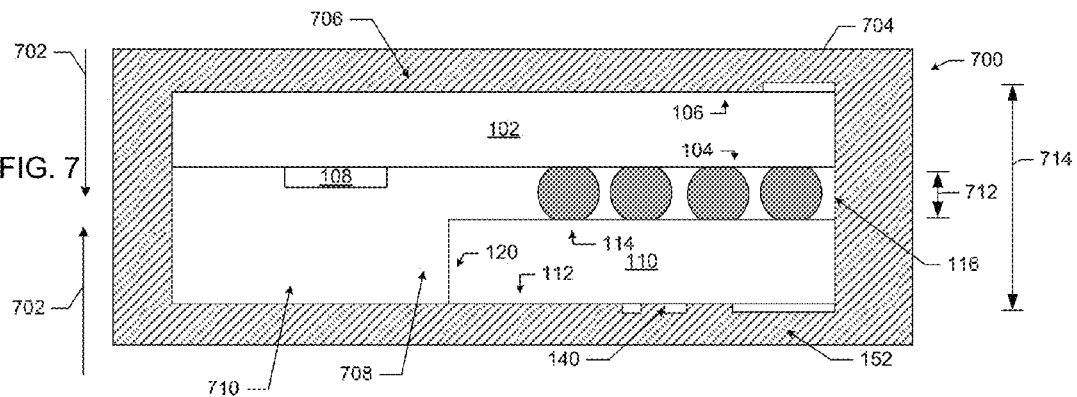

FIG. 7 depicts an assembly 700 subsequent to securing the assembly 600 in a mold chase 704. The mold chase 704 may have interior walls 706 that define an interior chamber 708. The dimensions of the interior chamber 708 may be selected so as to conform to the assembly 600 in some portions, but also to leave one or more open volumes (e.g., the volume 710). As noted above, in some embodiments, an array of assemblies 600 may take the form of a unitary body, and that unitary body may be secured in a mold chase having the form of an array of the shapes of the mold chase 704.

Additionally, the interior chamber 708 may have some dimensions that are slightly smaller than those of the assembly 600. For example, a "thickness" dimension 714 of the chamber 708 may be slightly smaller than the thickness 604 of the assembly 600. When the assembly 600 is inserted into the mold chase 704, and the mold chase 704 is closed, the assembly 600 may be compressed (e.g., as indicated by the arrows 702). Components of the assembly 600 that are malleable may deform in response to this compression. In particular, the solder joints 116 may be sufficiently malleable (e.g., less malleable than other components of the assembly 600) so as to be deformed by the pressure from the mold chase 704 and decrease in thickness (e.g., by undergoing controlled collapse). The thickness 712 of the solder joints 116 after compression in the mold chase 704 may be less than the thickness 602 of the solder joints 116 of the assembly 600. Consequently, the thickness 714 of the assembly 700 after compression in the mold chase 704 may be less than the thickness 604 of the assembly 600. The use of pressure from the mold chase 704 to form the solder joints 116 until the thickness 714 of the assembly 700 matches the interior dimensions of the chamber 708 may allow the thickness 714 to be precisely controlled to a desired value, regardless of the variation in the thickness 602 of the solder joints 116 of the assembly 600 that is typically caused by surface tension forces when the solder joints 116 are initially formed.

Figure 8:
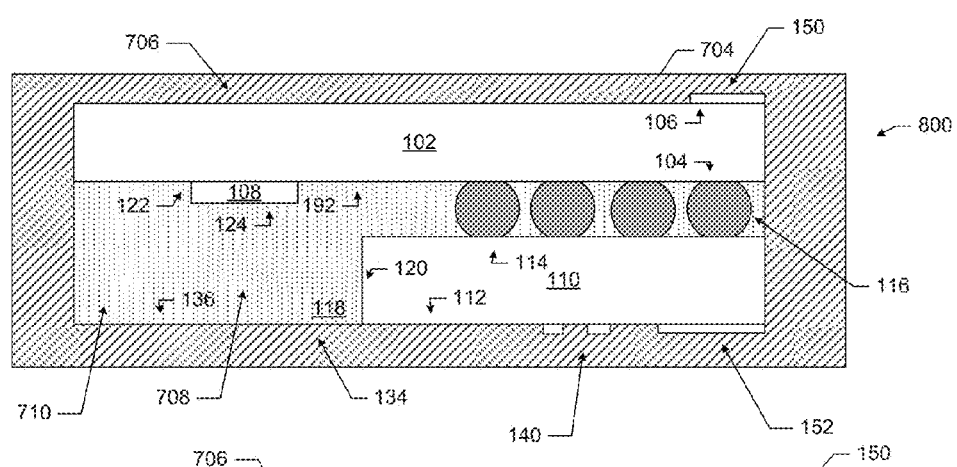

FIG. 8 depicts an assembly 800 subsequent to providing the molding compound 118 into the volume 710 of the chamber 708 of the mold chase 704 to contact the assembly 700. The molding compound 118 may be provided so as to fill the volume 710. As discussed above with reference to FIG. 1, in some embodiments, the molding compound 118 may be in contact with the first face 104 of the first PCB 102. In some embodiments, the molding compound 118 may be in contact with the second face 114 of the second PCB 110. In some embodiments, the molding compound 118 may cover the solder joints 116. In some embodiments, the molding compound 118 may cover the die 108. As shown in FIG. 8, the second face 192 of the molding compound 118 may be in contact with the first face 104 of the first PCB 102, and the first face 136 may be in contact with the walls 706 of the mold chase 704. Any of a number of molding techniques may be used to form the assemblies described herein. For example, injection molding may be used. In some embodiments, transfer molding may be advantageous.

Figure 9:
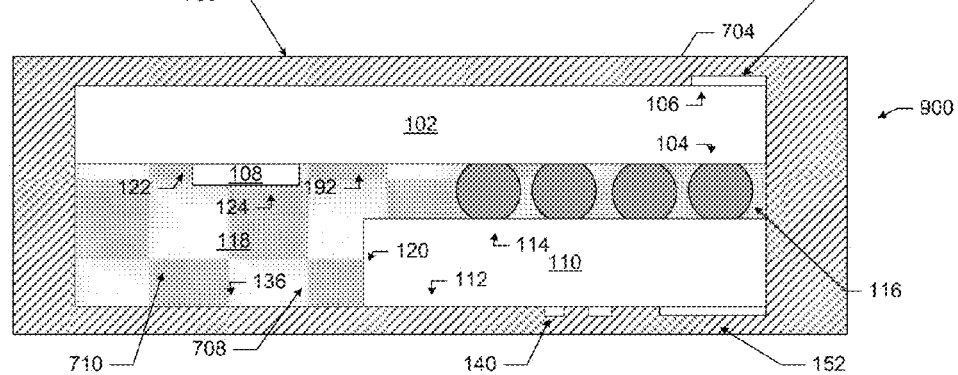

FIG. 9 depicts an assembly 900 subsequent to curing the molding compound 118 of the assembly 800. Once cured, the molding compound 118 may be substantially solid. In some embodiments, the molding process discussed above with reference to FIGS. 7-9 may be an exposed mold process. In some embodiments, the assembly 900 may be cured after it is removed from the mold chase 704. In some embodiments, curing may be initiated or accelerated through heating or the use of ultraviolet light, for example.

Figure 10:
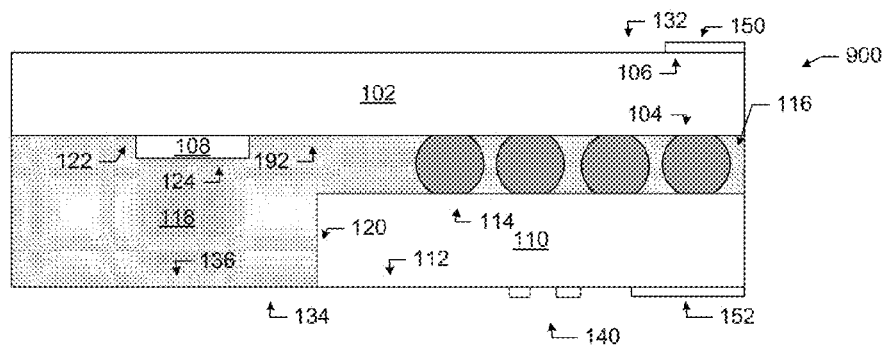

FIG. 10 depicts the assembly 900 subsequent to removing the assembly 900 from the mold chase 704 of FIG. 9. The assembly 900 may have a first face 134 and a second face 132.

Figure 11:
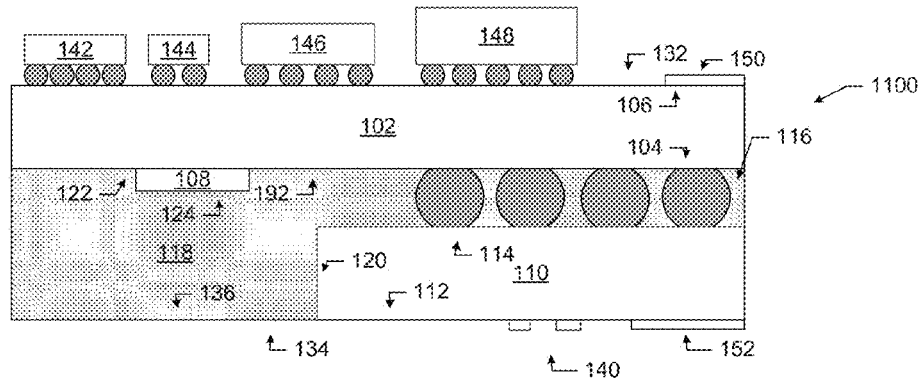

FIG. 11 depicts an assembly 1100, subsequent to surface mounting one or more IC packages (e.g., the IC packages 142-148) to the second face 132 of the assembly 900. The assembly 1100 may be the IC assembly 100. The first PCB 102 may include conductive contacts on the second face 106 to couple to conductive contacts of the surface-mounted IC packages, and conductive vias between the first face 104 and the second face 106 to couple electrical signals between the surface-mounted IC packages and the die 108 and/or the second PCB 110. The conductive contacts 150 of the first PCB 102 and the conductive contacts 152 of the second PCB 110 may be used to couple signals between one or more external devices (not shown) and any of the components of the IC assembly 100 (e.g., any of the IC packages 142-148 and/or the die 108). The operation of the IC assembly 100 may take the form of any of the embodiments discussed herein.

Figure 12:
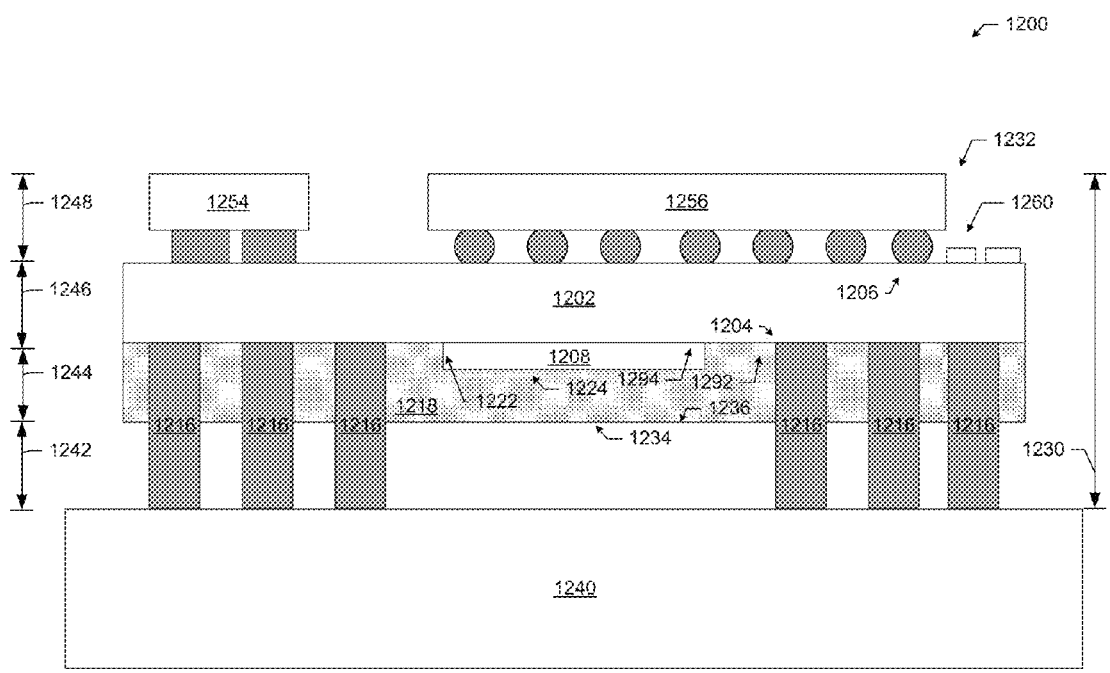
FIG. 12 is a side cross-sectional view of an IC assembly, in accordance with various embodiments.

FIG. 12 is a side cross-sectional view of an IC assembly 1200 disposed on a motherboard 1240, in accordance with various embodiments. The IC assembly 1200 may include a printed circuit board (PCB) 1202, a die 1208, a molding compound 1218, and one or more through mold solder joints 1216. The functionality of the IC assembly 1200 may be determined by the circuitry included in or disposed on the components of the IC assembly 1200. For example, in some embodiments, the IC assembly 1200 may include components arranged to form any of the devices described above with reference to the IC assembly 100. Any other suitable functionality may be provided by the IC assembly 1200 by appropriate selection and arrangement of the components of the IC assembly 1200.

The PCB 1202 may have a first face 1204 and a second face 1206 opposite to the first face 1204. The PCB 1202 may be formed from any conventional PCB materials and may have any desired number of layers. The PCB 1202 may include conductive contacts formed on the first face 1204 and/or the second face 1206, and vias between the first face 1204 and the second face 1206, to couple electrical signals along and between the faces 1204 and 1206.

The die 1208 may include a first face 1224, a second face 1294, and side faces 1222. As shown, the second face 1294 may be proximate to the first face 1204 of the PCB 1202. In some embodiments, the die 1208 may be electrically coupled to the first face 1204 of the PCB 102. For example, in some embodiments, the die 1208 may be wire bonded to the first face 1204 of the PCB 1202. Wires included in the wire bonds may extend from the first face 1224, the side faces 1222, or the second face 1294 of the die 108. Electrical signals transmitted through the electrical coupling between the die 1208 and the first face 1204 may be further transmitted through the PCB 1202 and to/from other components electrically coupled to the first face 1204 and/or the second face 1206 (e.g., components surface mounted to the second face 1206 and/or coupled to the PCB 1202 via the through mold solder joints 1216, as discussed below). In some embodiments, the die 1208 may be mechanically coupled to the first face 1204 of the PCB 1202 (e.g., via an adhesive and/or an electrical coupling mechanism, such as wire bonding or soldering). In some embodiments, the die 1208 may be attached using a flip chip process. Although only a single die 1208 is illustrated in FIG. 12, multiple dies may be mounted to the first face 1204 of the PCB 1202.

The die 1208 may take the form of any of the dies 108 discussed above with reference to FIG. 1. For example, the die 1208 may include a silicon or other semiconductor material, and a plurality of devices (e.g., transistor-based devices) configured to perform a desired function. For example, in some embodiments, the die 1208 may be an ASIC (e.g., any of the ASICs discussed above with reference to the die 108). In some embodiments, the die 1208 may be a post-dicing die. Since a post-dicing die 1208 may be much thinner than a further packaged die that performs the same function, the use of a post-dicing die 1208 in the IC assembly 1200 may enable the IC assembly 1200 to achieve a reduced thickness 1230 relative to the use of a further packaged die. The die 1208 may include a single piece of silicon or multiple pieces of silicon, and may include any suitable type of electronic components. The molding compound 1218 may have a first face 1236 and a second face 1292, and may contact the die 1208. For example, in some embodiments, the molding compound 1218 may be in contact with and cover the side faces 1222 of the die 1208. In some embodiments, the molding compound 1218 may be in contact with and cover the side faces 1222, and may be in contact with the first face 1224. In some embodiments, the molding compound 1218 may cover the first face 1224. In some embodiments in which there is a "gap" between the second face 1294 of the die 1208 and the first face 1204 of the PCB 1202, the molding compound 1218 may contact the second face 1294. In some embodiments, the molding compound 1218 may cover the side faces 1222 and the first face 1224 of the die 1208. In some embodiments, the molding compound 1218 may cover the die 1208. In some embodiments, the first face 1236 of the molding compound 1218 may be spaced away from the first face 1224 of the die 1208 (e.g., by an intervening portion of the molding compound 1218, as shown). In some embodiments, the first face 1236 may be substantially co-planar with the first face 1224. In some embodiments, the second face 1292 of the molding compound 1218 may be substantially co-planar with the second face 1294 of the die 1208.

The molding compound 1218 (e.g., the second face 1292 of the molding compound 1218) may be in contact with the first face 1204 of the PCB 1202. In some embodiments, the molding compound 1218 may cover the first face 1204 of the PCB 1202. In some embodiments, the molding compound 1218 may cover the through mold solder joints 1216.

Any suitable molding compound may be used as the molding compound 1218, such as any of the examples discussed above with reference to the molding compound 118 of FIG. 1. The molding compound 1218 may be formed by any suitable process, such as the molding processes discussed below and illustrated with reference to FIGS. 15-18.

The IC assembly 1200 may have a first face 1234 and a second face 1232. In some embodiments, the first face 1234 may include at least a portion of the first face 1236 of the molding compound 1218 (e.g., as shown in FIG. 12). In some embodiments, the first face 1234 may be substantially entirely provided by the first face 1236 of the molding compound 1218. In some embodiments, the first face 1234
may include the first face 1236 of the molding compound 1218, and may have the through mold solder joints 1216 extending through the first face 1236 of the molding compound 1218. In some embodiments, the first face 1234 may be spaced away from the first face 1236 of the molding compound 1218. In some such embodiments, additional components may be disposed between the first face 1234 and the first face 1236 of the molding compound 1218. For example, additional PCBs or other components may be disposed between the first face 1236 of the molding compound 1218 and the first face 1234. The additional PCBs may take the form of any of the PCBs discussed herein. For example, the IC assembly 1200 may include more than one PCB, and these PCBs may be coupled to each other in any desired arrangement (e.g., using solder joints similar to the solder joints 116 discussed above with reference to the IC assembly 100).

In some embodiments, the second face 1232 may include at least a portion of the second face 1206 of the PCB 1202. In some embodiments, the second face 1232 may be substantially entirely provided by the second face 1206 of the PCB 1202 (e.g., as shown in FIG. 12). In some embodiments, the second face 1232 may include at least a portion of the second face 1292 of the molding compound 1218 (not shown). In some embodiments, the second face 1232 may be spaced away from the second face 1206 of the PCB 1202. In some such embodiments, additional components may be disposed between the second face 1206 of the PCB 1202 and the second face 1232. For example, additional PCBs may be disposed between the PCB 1202 and the second face 1232 (e.g., in accordance with any of the embodiments discussed above with reference to the first face 1234).

In any of the foregoing embodiments, the first face 1234 and/or the second face 1232 may have a protective coating (e.g., a plastic coating, not shown) disposed thereon. Such coatings may be conventional, and are not discussed further herein.

As noted above, the IC assembly 1200 may include one or more through mold solder joints 1216. The through mold solder joints 1216 may electrically couple the die 1208 and the motherboard 1240 via the PCB 1202. In particular, the through mold solder joints 1216 may electrically contact conductive contacts on the first face 1204 of the PCB 1202. The die 1208 may be electrically coupled to the PCB 1202 as discussed above (e.g., via one or more conductive contacts or wire bonds on the first face 1204 of the PCB 1202). The PCB 1202 may include one or more vias that may couple signals between contacts on the first face 1204 to various layers in the PCB 1202, to electrical contacts on the second face 1206, or to other electrical contacts on the first face 1204. In some embodiments, the electrical signals may be transmitted between the die 1208 and the through mold solder joints 1216 through such electrical pathways. When the through mold solder joints 1216 contact electrical contacts on the motherboard 1240, signals may be transmitted between the motherboard 1240 and the die 1208. In some embodiments, conductive contacts and/or vias may be formed in the PCB 1202 prior to coupling the die 1208 to the first face 1204 of the PCB 1202, prior to providing the molding compound 1218 to the IC assembly 1200, and/or prior to providing the through mold solder joints 1216.

As used herein, a "motherboard" may refer to any circuit board on which the IC assembly 1200 may be disposed and coupled to via the through mold solder joints 1216. Thus, in some embodiments, the through mold solder joints 1216 may be regarded as providing second-level interconnects between the motherboard 1240 and the IC assembly 1200.

The structure illustrated in FIG. 12 may be contrasted with some conventional packaging approaches, in which a mold may be located on the top side of a substrate, while any second-level interconnects may be on the bottom, opposite side of the substrate, facing the motherboard.

In some embodiments, the IC assembly 1200 may include additional components. For example, the IC assembly 1200 may include one or more probe pads 1260. The probe pads 1260 may be disposed on the second face 1232 of the IC assembly 1200 (e.g., on the second face 1206 of the PCB 1202, as shown in FIG. 12). The probe pads 1260 may take the form of any of the embodiments of the probe pads 140 discussed above with reference to the IC assembly 100. In some embodiments, no probe pads 1260 may be included in the IC assembly 1200.

The IC assembly 1200 may include one or more IC packages surface mounted to the second face 1206 of the PCB 1202. In FIG. 12, the IC packages 1254 and 1256 are illustrated as surface mounted to the second face 1206 of the PCB 1202. In the illustrated embodiment, the second face 1206 of the PCB 1202 coincides with the second face 1232 of the IC assembly 1200. Any desired IC package may be surface mounted to the second face 1206 of the PCB 1202. For example, any of the IC packages 142-148 discussed above with reference to the IC assembly 100 may be surface mounted to the second face 1232 of the IC assembly 1200. In some embodiments, the IC packages 1254 and 1256 may include non-volatile memory, dynamic random access memory (DRAM), a power system, or passive components, for example. In some embodiments, one or more of the IC packages 1254 and 1256 may not be surface mounted to the second face 1206 of the PCB 1202, but may instead be coupled (e.g., in a post-dicing form) to the first face 1204 as discussed above with reference to the die 1208.

As illustrated in FIG. 12, the IC packages 1254 and 1256 surface mounted to the second face 1232 of the IC assembly 1200 may not be covered by the molding compound 1218. In particular, in some embodiments, any IC packages included on the second face 1232 of the IC assembly 1200 (e.g., the IC packages 1254 and 1256) may be surface mounted to the second face 1232 after the molding compound 1218 is provided to the IC assembly 1200. Because such packages are not embedded in molding compound, the packages may be readily mounted, replaced, or removed during the lifetime of the IC assembly 1200.

Vias included in the PCB 1202 may be used to couple electrical signals between any of the IC packages surface-mounted to the second face 1232 of the IC assembly 1200 and the die 1208. Vias included in the PCB 1202, and the through mold solder joints 1216, may be used to couple electrical signals between any of the IC packages surface mounted to the second face 1232 of the IC assembly 1200 and the motherboard 1240.

The second face 1232 of the IC assembly 1200 and/or the motherboard 1240 may include one or more conductive contacts that may be used to enable electrical coupling between the circuitry of the IC assembly 1200 and external devices (not shown).

In some embodiments (e.g., embodiments in which the IC assembly 1200 implements a solid state drive), the area of the second face 1206 of the PCB 1202 (e.g., on which the IC packages 1254 and 1256 are disposed) may be less than 400 square millimeters. For example, the area may be approximately 20 millimeters by 20 millimeters. This may accommodate a non-volatile memory package that is 14 millimeters by 18 millimeters, and a PMIC package that is 4 millimeters by 4 millimeters. An area greater than 120 square millimeters may be available for additional components (e.g., packages of passive components).

The "height" of the IC assembly 1200 may vary by the application and desired components. For example, in some embodiments, the solder standoff 1242 may be approximately 200 microns, the mold cap thickness 1244 may be approximately 210 microns, the substrate thickness 1246 may be approximately 200 microns, and the top component height 1248 may be approximately 800 microns (yielding a total height, including a tolerance, of approximately 1500 microns). In some embodiments, the solder standoff 1242 may be approximately 200 microns, the mold cap thickness 1244 may be approximately 200 microns, the substrate thickness 1246 may be approximately 200 microns, and the top component height 1248 may be approximately 650 microns (yielding a total height, including a tolerance, of approximately 1350 microns). In some embodiments, the solder standoff 1242 may be approximately 100 microns, the mold cap thickness 1244 may be approximately 210 microns, the substrate thickness 1246 may be approximately 130 microns, and the top component height 1248 may be approximately 500 microns (yielding a total height, including a tolerance, of approximately 1000 microns). IC assemblies 1200 (e.g., solid state drives) having these dimensions may be advantageously included in small electronic devices (e.g., handheld mobile devices).

FIGS. 13-22 illustrate side, cross-sectional views of various assemblies subsequent to various operations in the manufacture of an IC assembly, in accordance with various embodiments. For ease of illustration, the assemblies depicted in FIGS. 13-22 may represent various stages in the manufacture of the IC assembly 1200, but the operations discussed with reference to FIGS. 13-22 may be used to manufacture any suitable IC assembly. In various embodiments, one or more of these operations may be omitted, repeated, or performed in an alternate order, as suitable.

Additionally, as discussed above with reference to FIGS. 4-11, FIGS. 13-22 depict operations performed with reference to a single IC assembly 1200, but this is simply for ease of illustration. In some embodiments, a number of IC assemblies 1200 may be formed in parallel (e.g., tens of assemblies). For example, multiple IC assemblies 1200 may be formed in an array, and the operations discussed with reference to FIGS. 13-22 may be performed on the array simultaneously or in any suitable order. After an array of the IC assemblies 1200 are formed, the array may be cut into pieces (not illustrated in FIGS. 13-22) to segment the IC assemblies 1200 from each other. Manufacturing the IC assembly 1200 in batches may improve throughput.

Figure 13:
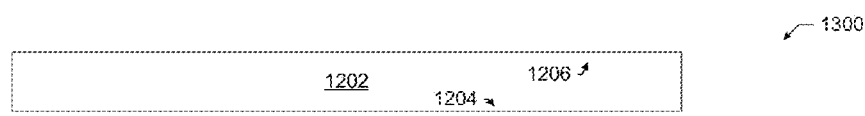
FIGS. 13-22 illustrate side, cross-sectional views of various assemblies subsequent to various operations in the manufacture of an IC assembly as illustrated in FIG. 12, in accordance with various embodiments.

FIG. 13 depicts an assembly 1300 subsequent to providing the PCB 1202. The PCB 1202 may include conductive contacts on the second face 1206 and/or on the first face 1204, arranged to couple with components to be attached at subsequent operations. As discussed above, the PCB 1202 may also include conductive vias between the first face 1204 and the second face 1206 to couple electrical signals between the faces. The arrangement of these contacts and vias may be planned in accordance with the arrangement of the additional components to be included in the IC assembly 1200, using conventional PCB design techniques.

Figure 14:
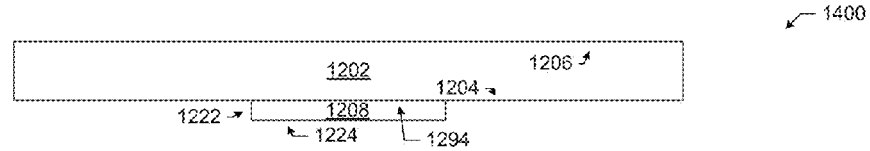

FIG. 14 depicts an assembly 1400 subsequent to coupling the die 1208 to the first face 1204 of the PCB 1202 of the assembly 1300. In particular, the second face 1294 of the die 1208 may be disposed proximate to the first face 1204 of the PCB 1202. As discussed above with reference to FIG. 12, the coupling between the die 1208 and the PCB 1202 may take any of a number of forms. For example, in some embodiments, the die 1208 may be wire bonded to the PCB 1202.

Figure 15:
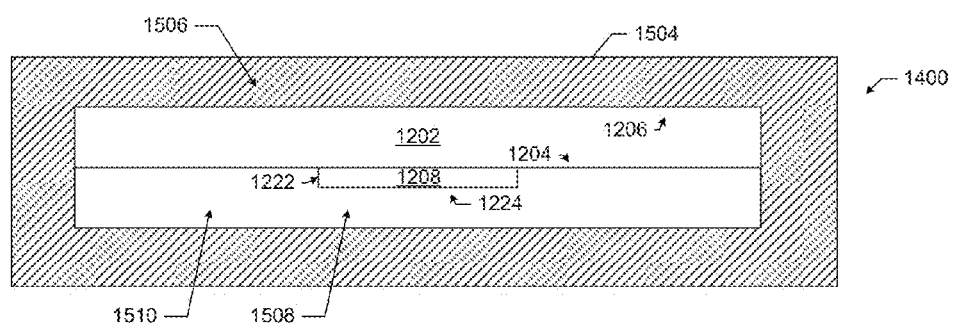

FIG. 15 depicts the assembly 1400 secured in a mold chase 1504. The mold chase 1504 may have interior walls 1506 that define an interior chamber 1508. The dimensions of the interior chamber 1508 may be selected so as to conform to the assembly 1400 in some portions, but also to leave one or more open volumes (e.g., the volume 1510).

Figure 16:
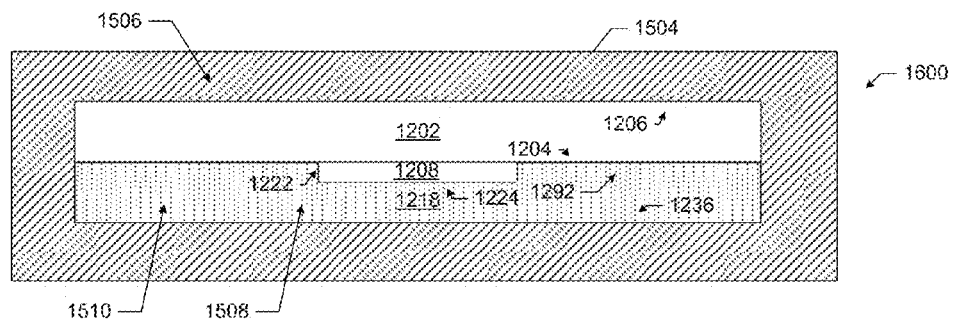

FIG. 16 depicts an assembly 1600 subsequent to providing the molding compound 1218 into the volume 1510 of the chamber 1508 of the mold chase 1504 to contact the assembly 1400. The molding compound 1218 may be provided so as to fill the volume 1510. As discussed above with reference to FIG. 12, in some embodiments, the molding compound 1218 may be in contact with the first face 1204 of the PCB 1202. In some embodiments, the molding compound 1218 may cover the die 1208. As shown in FIG. 16, the second face 1292 of the molding compound 1218 may be in contact with the first face 1204 of the PCB 1202, and the first face 1236 may be in contact with the walls 1506 of the mold chase 1504. As noted above, any of a number of molding techniques may be used to form the assemblies described herein. For example, injection molding may be used. In some embodiments, transfer molding may be advantageous.

Figure 17:
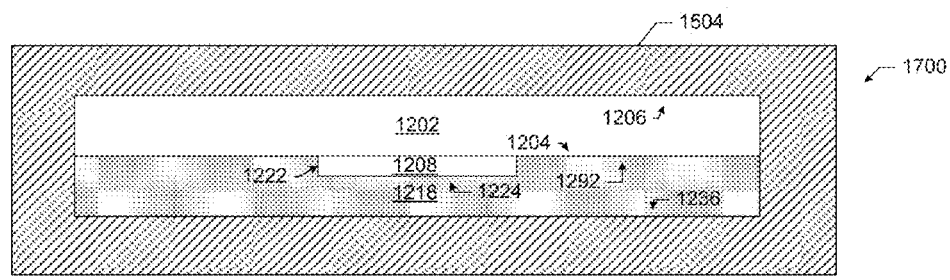

FIG. 17 depicts an assembly 1700 subsequent to curing the molding compound 1218 of the assembly 1600. Once cured, the molding compound 1218 may be substantially solid. In some embodiments, the molding process discussed above with reference to FIGS. 15-17 may be an exposed mold process.

Figure 18:
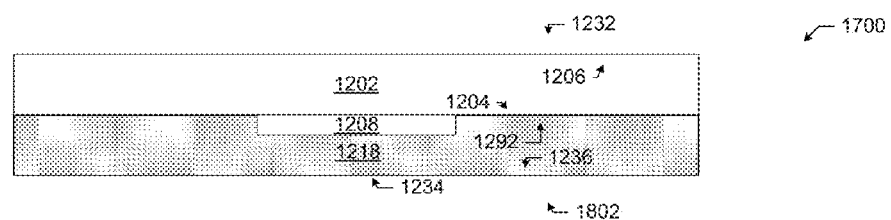

FIG. 18 depicts the assembly 1700 (FIG. 17) subsequent to removing the assembly 1700 from the mold chase 1504 of FIG. 17. The assembly 1700 may have a first face 1234 and a second face 1232.

Figure 19:
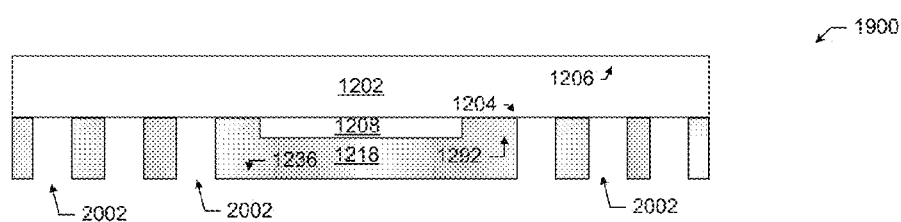

FIG. 19 depicts an assembly 1900 subsequent to forming one or more holes in the molding compound 1218 of the assembly 1800 to form one or more cavities 2002. The cavities 2002 may be located in positions in which through mold solder joints are to be formed. The cavities 2002 may be formed by drilling through the molding compound 1218 (e.g., using a laser drilling process) until conductive contacts on the first face 1204 of the PCB 1202 are exposed. As discussed above, these conductive contacts may be formed on the first face 1204 of the PCB 1202 prior to coupling the die 1208 to the first face 1204 and prior to providing the molding compound 1218. In some embodiments, the cavities 2002 may be several hundred microns deep or less, and may have a diameter of several hundred microns to approximately 1 millimeter. Other dimensions may be used.

Figure 20:
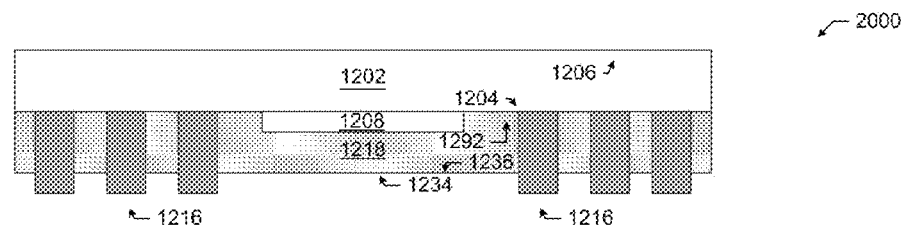

FIG. 20 depicts an assembly 2000 subsequent to depositing a solderable material in the cavities 2002 of the assembly 1900 to form the through mold solder joints 1216. Examples of solderable material include solder balls (e.g., those used for BGA) and solder paste. The through mold solder joints 1216 may extend beyond the first face 1236 of the molding compound 1218, as shown in FIG. 20. In some embodiments, forming the solder joints 1216 may involve two or more phases of depositing a solderable material (e.g., in the form of a solder ball), and reflowing the material. In some embodiments, a first portion of solderable material may be deposited on the first face 1204 of the PCB 1202 prior to any molding operations, the first portion of solderable material may be exposed (e.g., by drilling) after the molding process, and additional solderable material may be deposited on the first portion of solderable material to form the solder joints 1216.

Figure 21:
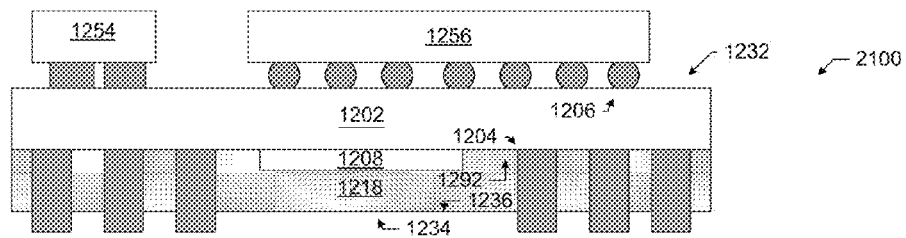

FIG. 21 depicts an assembly 2100 subsequent to surface mounting one or more IC packages (e.g., the IC packages 1254 and 1256) to the second face 1232 of the assembly 2000. The assembly 2100 may be the IC assembly 1200. The PCB 1202 may include conductive contacts on the second face 1206 to couple to conductive contacts of the surface-mounted IC packages, and conductive vias between the first face 1204 and the second face 1206 to couple electrical signals between the surface-mounted IC packages and the die 1208 and/or the through mold solder joints 1216.

Figure 22:
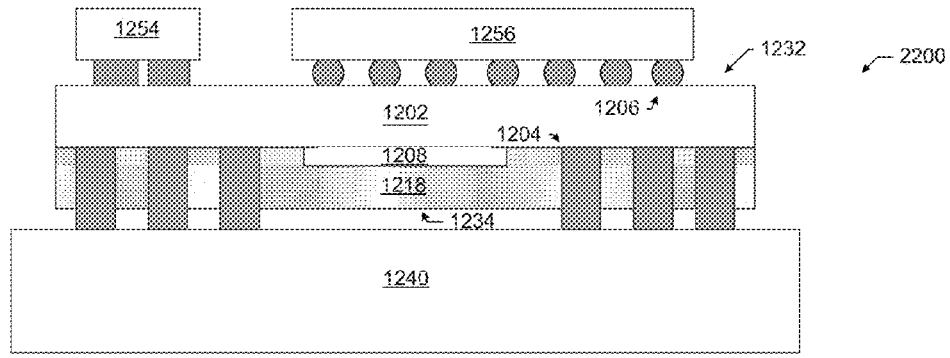

FIG. 22 depicts an assembly 2200 subsequent to coupling the IC assembly 2100 (e.g., the IC assembly 1200) to the motherboard 1240. In particular, the through mold solder joints 1216 may couple to conductive contacts on the motherboard 1240 to enable electrical signals to flow between the IC assembly 2200 and the motherboard 1240. The operation of the IC assembly 2200 may take the form of any of the embodiments discussed herein.

Figure 23:
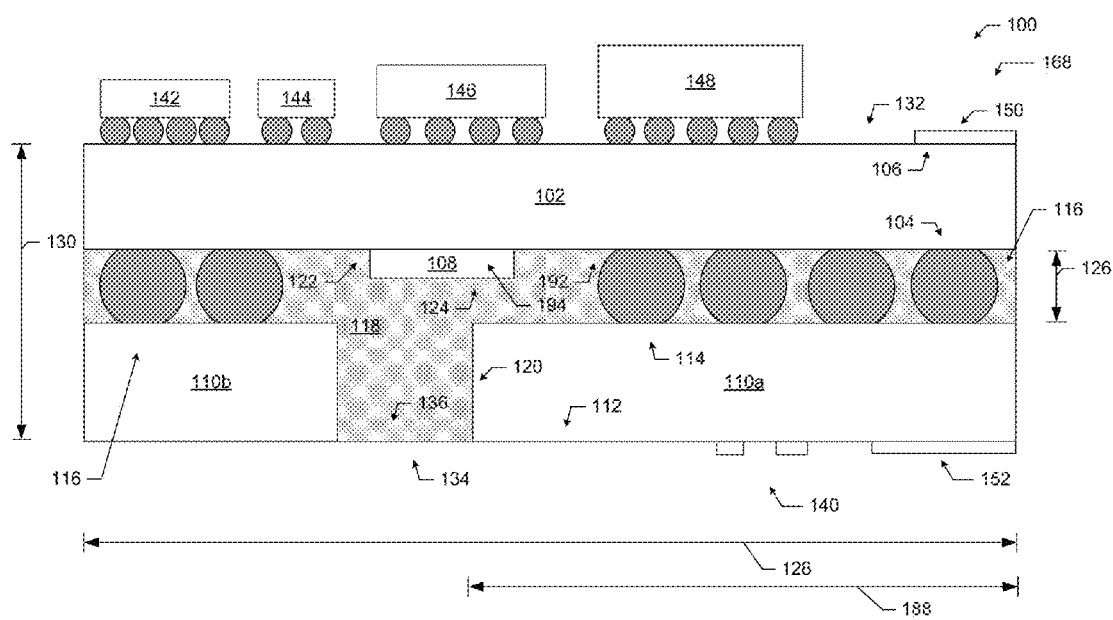
FIGS. 23 and 24 are side cross-sectional views of IC assemblies, in accordance with various embodiments.

As noted above, in some embodiments, two or more PCBs 110 may be coupled to the first face 104 of the first PCB 102. In some embodiments, any one or more PCBs 110 coupled to the first face 104 of the first PCB 102 may have "windows" or other cut-out sections through which components (e.g., dies) may be coupled to the first face 104 of the first PCB 102. FIG. 23 is a side cross-sectional view of an embodiment of the IC assembly 100, including the first PCB 102, the die 108, the molding compound 118, and two second PCBs 110*a* and 110*b*. Remaining elements of the IC assembly 100 of FIG. 23 may take the form of any of the embodiments of like elements discussed above with reference to FIG. 1. In some embodiments, the IC assembly 100 of FIG. 23 may include components arranged to form a solid state drive. Any other suitable functionality may be provided by the IC assembly 100 by appropriate selection and arrangement of the components of the IC assembly 100 of FIG. 23. Manufacturing of the IC assembly 100 of FIG. 23 may be performed substantially in accordance with the operations discussed above with reference to FIGS. 4-11, with modifications to accommodate the difference in structure.

Figure 24:
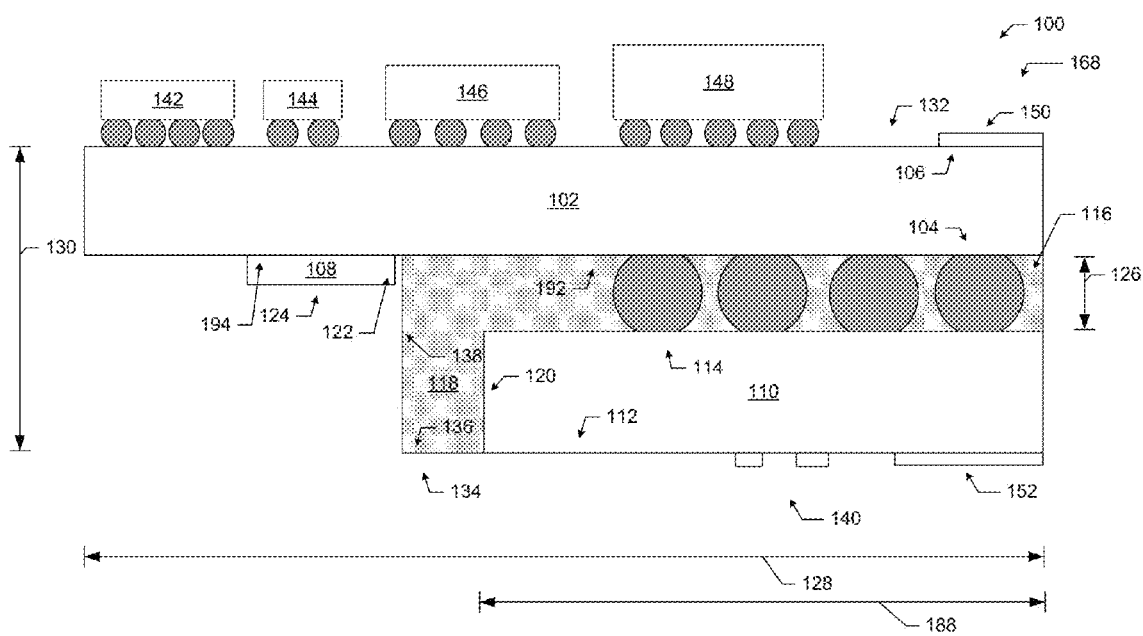

As noted above, in some embodiments, the molding compound 118 may not contact the die 108. An example of such an embodiment is illustrated in FIG. 24, which depicts a side cross-sectional view of an embodiment of the IC assembly 100. Remaining elements of the IC assembly 100 of FIG. 24 may take the form of any of the embodiments of like elements discussed above with reference to FIG. 1. As shown in FIG. 24, in some embodiments, a side face 138 of the molding compound 118 may be spaced away from the die 108. In other embodiments, the molding compound 118 may contact the side face 122 of the die 108, but may not contact the first face 124. Embodiments in which the molding compound 118 does not contact the die 108 may be advantageous when the die 108 is flip chip mounted to the first face 104 of the first PCB 102. In particular, keeping a flip chip die 108 uncovered by the molding compound 118 may improve heat dissipation from the die 108. In some embodiments, a flip chip die 108 may be contacted on the side faces 122 by the molding compound 118. Manufacturing of the IC assembly 100 of FIG. 24 may be performed substantially in accordance with the operations discussed above with reference to FIGS. 4-11, with modifications to accommodate the difference in structure. For example, the die 108 may be mounted (e.g., flip chip mounted) after the molding process is complete or before the molding process commences.

Figure 25:
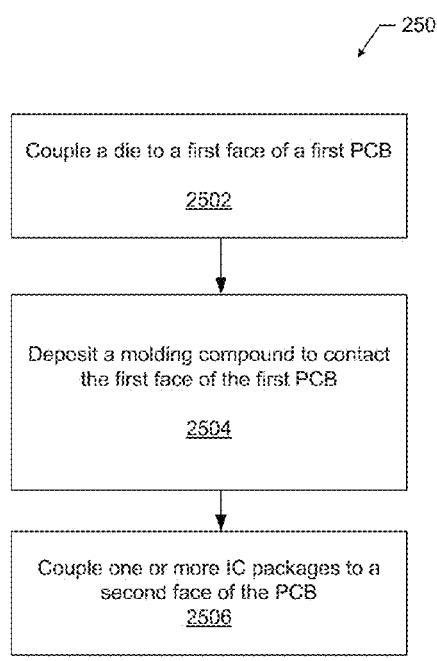
FIG. 25 is a flow diagram of an illustrative process for manufacturing an IC assembly, in accordance with various embodiments.

FIG. 25 is a flow diagram of an illustrative process 2500 for manufacturing an IC assembly, in accordance with various embodiments. Although operations of the process 2500 may be discussed with reference to the IC assemblies 100 and 1200 (and components thereof), this is simply for illustrative purposes and the process 2500 may be utilized to manufacture any suitable IC assembly.

At 2502, a die may be coupled to a first face of the PCB. For example, the die 108 may be coupled to the first face 104 of the PCB 102, as discussed above with reference to the IC assembly 100 (FIGS. 1, 23 and 24). In another example, the die 1208 may be coupled to the first face 1204 of the PCB 1202, as discussed above with reference to the IC assembly 1200 (FIG. 12). The die may be coupled to the first face of the PCB using any suitable technique (e.g., the techniques disclosed herein).

At 2504, a molding compound may be deposited to contact the first face of the PCB 102. In some embodiments, the molding compound may contact the die. For example, the molding compound 118 may be deposited to contact the first face 104 of the PCB 102 and at least partially cover the die 108 in the IC assembly 100 (FIGS. 1 and 23). In another example, the molding compound 1218 may be deposited to contact the first face 1204 of the PCB 1202 and at least partially cover the die 1208 in the IC assembly 1200 (FIG. 12). In other embodiments, the molding compound may not contact the die (FIG. 24). The molding compound may be deposited using any suitable technique (e.g., the techniques discussed herein with reference to FIGS. 7-10 and 15-18).

At 2506, one or more IC packages may be coupled to a second face of the PCB. The second face of the PCB may be opposite to the first face of the PCB. For example, one or more IC packages 142-148 may be coupled to the second face 106 of the PCB 102 in the IC assembly 100 (FIGS. 1, 23 and 24). In another example, one or more IC packages 1254 and 1256 may be coupled to the second face 1206 of the PCB 1202 in the IC assembly 1200 (FIG. 12). The process 2500 may then end.

In some embodiments, the process 2500 may include additional operations. For example, in some embodiments, the PCB of 2502 may be a first PCB, and the process 2500 may include coupling a second face of the second PCB to the first face of the first PCB via one or more solder joints. For example, the second face 114 of the second PCB 110 may be coupled to the first face 104 of the first PCB 102 via the one or more solder joints 116. In some embodiments, the one or more solder joints may be compressed to reduce their thickness prior to depositing the molding compound at 2504.

In some embodiments, after depositing the molding compound 2504, one or more cavities may be formed in the molding compound to expose one or more conductive contacts on the first face of the PCB, and a solderable material may be deposited in the cavities to form solder joints. For example, through mold solder joints 1216 may be provided to the IC assembly 1200 by forming cavities in the molding compound 1218 and filling the cavities with solderable material (e.g., as discussed above with reference to FIGS. 19-20).

In some embodiments, the IC assembly formed in accordance with the process 2500 may be mounted to a motherboard (e.g., via one or more through mold solder joints, as discussed above with reference to the IC assembly 1200 of FIG. 12).

In some embodiments, depositing the molding compound at 2504 may include securing the die and the PCB in a mold chase, providing the molding compound to the mold chase to contact the first face of the PCB, and curing the molding compound.

Figure 26:
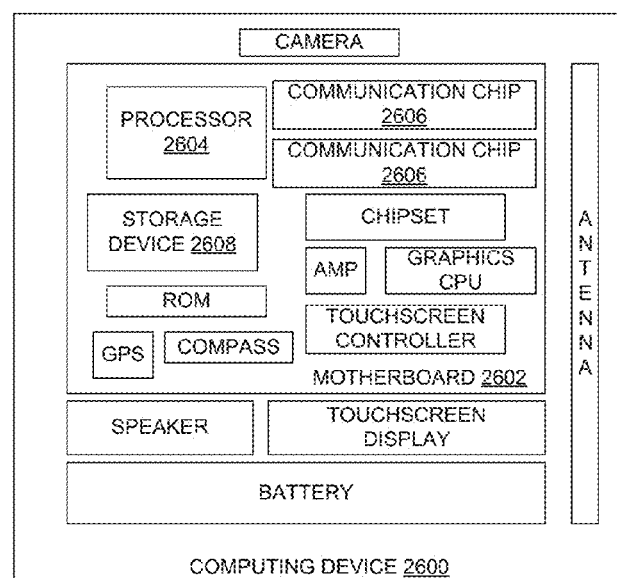
FIG. 26 is a block diagram of an example computing device that may include one or more of any of the IC assemblies disclosed herein.

Embodiments of the present disclosure may be implemented into a system using any suitable hardware that may benefit from the IC assembly structures and manufacturing techniques disclosed herein. FIG. 26 schematically illustrates a computing device 2600, in accordance with some implementations, which may include one or more of any of the IC assemblies disclosed herein (e.g., those formed in accordance with the IC assembly 100 of FIG. 1, 23 or 24 and/or the IC assembly 1200 of FIG. 12). In particular, in some embodiments, embodiments of IC assemblies discussed above with reference to the IC assembly 100 may be configured as the computing device 2600, or a portion of the computing device 2600. For example, the IC assembly 100 may be configured as a storage device 2608 of the computing device 2600 (discussed below). In some embodiments, embodiments of IC assemblies discussed above with reference to the IC assembly 1200 may be configured as the computing device 2600, or a portion of the computing device 2600.

The computing device 2600 may be, for example, a mobile communication device or a desktop or rack-based computing device. The computing device 2600 may house a board such as motherboard 2602. The motherboard 2602 may include a number of components, including (but not limited to) a processor 2604 and at least one communication chip 2606. Any of the components discussed herein with reference to the computing device 2600 may be arranged in an IC assembly (such as the IC assembly 100 of FIG. 1, 23 or 24 or the IC assembly 1200 of FIG. 12). The processor 2604 may be physically and electrically coupled to the motherboard 2602. In some implementations, the at least one communication chip 2606 may also be physically and electrically coupled to the motherboard 2602. In further implementations, the communication chip 2606 may be part of the processor 2604.

The computing device 2600 may include a storage device 2608. In some embodiments, the storage device 2608 may take the form of any of the embodiments of the IC assembly 100 or the IC assembly 1200 discussed herein. In some embodiments, the storage device 2608 may include one or more solid state drives. Examples of storage devices that may be included in the storage device 2608 include volatile memory (e.g., DRAM), non-volatile memory (e.g., read-only memory, ROM), flash memory, and mass storage devices (such as hard disk drives, compact discs (CDs), digital versatile discs (DVDs), and so forth)

Depending on its applications, the computing device 2600 may include other components that may or may not be physically and electrically coupled to the motherboard 2602. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera. In various embodiments, any one or more of these components may be formed as the IC assembly 100 and/or the IC assembly 1200.

The communication chip 2606 and the antenna may enable wireless communications for the transfer of data to and from the computing device 2600. The term "wireless"

and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide area (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2606 may operate in accordance with a GSM, General Packet Radio Service (GPRS), Universal Mobile Telecommunications System (UMTS), High Speed Packet Access (HSPA), Evolved HSPA (E-HSPA), or LTE network. The communication chip 2606 may operate in accordance with Enhanced Data for GSM Evolution (EDGE), GSM EDGE Radio Access Network (GERAN), UTRAN, or Evolved UTRAN (E-UTRAN). The communication chip 2606 may operate in accordance with CDMA, Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 2606 may operate in accordance with other wireless protocols in other embodiments.

The computing device 2600 may include a plurality of communication chips 2606. For instance, a first communication chip 2606 may be dedicated to shorter range wireless communications such as Wi-Fi and Bluetooth, and a second communication chip 2606 may be dedicated to longer range wireless communications such as GPS, EDGE, GPRS, CDMA, WiMAX, LTE, EV-DO, and others. In some embodiments, the communication chip 2606 may support wired communications. For example, the computing device 2600 may include one or more wired servers.

The processor 2604 and/or the communication chip 2606 of the computing device 2600 may include one or more dies or other components in an IC package. The term "processor" may refer to any device or portion of a device that processes electronic data from registers and/or memory to transform that electronic data into other electronic data that may be stored in registers and/or memory. In various embodiments, the dies may be included in the IC assembly 100 and/or the IC assembly 1200.

In various implementations, the computing device 2600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 2600 may be any other electronic device that processes data. In some embodiments, the IC assembly disclosed herein may be implemented in a high-performance computing device.

The following paragraphs provide examples of the embodiments disclosed herein. Example 1 is an IC assembly, including: a first PCB having a first face and an opposing second face; a die electrically coupled to the first face of the first PCB; a second PCB having a first face and an opposing second face, wherein the second face of the second PCB is coupled to the first face of the first PCB via one or more solder joints; and molding compound, wherein the molding compound is in contact with the first face of the first PCB and the second face of the second PCB.

Example 2 may include the subject matter of Example 1, and may further specify that the die is an ASIC.

Example 3 may include the subject matter of any of Examples 1-2, and may further specify that a distance between the second face of the first PCB and the first face of the second PCB is less than 1 millimeter.

Example 4 may include the subject matter of any of Examples 1-3, and may further specify that the first PCB has a length in a first direction and the second PCB has a length in the first direction that is less than the length of the first PCB.

Example 5 may include the subject matter of any of Examples 1-4, and may further specify that the molding compound contacts the die.

Example 6 may include the subject matter of any of Examples 1-5 and may further specify that the first face of the second PCB includes a plurality of conductive contacts.

Example 7 may include the subject matter of any of Examples 1-6, and may further specify that the molding compound does not contact the die.

Example 8 may include the subject matter of Example 7, and may further specify that the die is flip-chip mounted to the first face of the first PCB.

Example 9 may include the subject matter of any of Examples 1-8, and may further include one or more IC packages surface mounted to the second face of the first PCB.

Example 10 may include the subject matter of any of Examples 1-9, and may further specify that the die is electrically coupled to the first face of the first PCB via one or more wire bonds.

Example 11 may include the subject matter of any of Examples 1-10, and may further specify that the solder joints are covered by the molding compound.

Example 12 may include the subject matter of any of Examples 1-11, and may further specify that the IC assembly includes an edge finger connector, and wherein the edge finger connector includes conductive contacts on the second face of the first PCB.

Example 13 may include the subject matter of Example 12, and may further specify that the edge finger connector includes conductive contacts on the first face of the second PCB.

Example 14 may include the subject matter of any of Examples 1-13, and may further specify that the IC assembly is a solid state drive.

Example 15 may include the subject matter of any of Examples 1-14, and may further specify that a width of the IC assembly is approximately 22 millimeters.

Example 16 may include the subject matter of Example 15, and may further specify that a length of the IC assembly is approximately 42 millimeters.

Example 17 is an IC assembly, including: a PCB having a first face and an opposing second face; a die electrically coupled to the first face of the PCB: molding compound having a first face and an opposing second face, wherein the second face of the molding compound is in contact with the first face of the PCB and the die is contacted by the molding compound; and one or more through mold solder joints, extending from the first face of the PCB, through the molding compound, and beyond the second face of the molding compound.

Example 18 may include the subject matter of Example 17, and may further specify that: the IC assembly has a first face and an opposing second face; the second face of the IC assembly includes the second face of the PCB; and one or more IC packages are surface mounted to the second face of the PCB.

Example 19 may include the subject matter of Example 18, and may further specify that the one or more IC packages are not surrounded by a molding compound.

Example 20 may include the subject matter of any of Examples 17-19, and may further specify that the through mold solder joints are coupled to a motherboard such that the die is disposed between the PCB and the motherboard.

Example 21 is a method of manufacturing an IC assembly, including: coupling a die to a first face of a PCB, wherein the PCB has a second face opposite to the first face; depositing a molding compound to contact the first face of the PCB; and coupling one or more IC packages to the second face of the PCB.

Example 22 may include the subject matter of Example 21, and may further specify that the PCB is a first PCB, and may further include: coupling a second face of a second PCB to the first face of the first PCB via one or more solder joints with a first thickness; and prior to depositing the molding compound, compressing the one or more solder joints to a second thickness less than the first thickness.

Example 23 may include the subject matter of any of Examples 21-22, and may further include: after depositing the molding compound, forming one or more cavities through the molding compound to expose one or more conductive contacts on the first face of the PCB; and depositing a solderable material to form solder joints in the one or more cavities.

Example 24 may include the subject matter of Example 23, and may further include mounting the IC assembly to a motherboard via the solder joints.

Example 25 may include the subject matter of any of Examples 21-24, and may further specify that depositing the molding compound includes: after coupling the die to the first face of the PCB, securing the die and the PCB in a mold chase; providing the molding compound to the mold chase to contact the first face of the PCB; and curing the molding compound.

What is claimed is:

1. An integrated circuit (IC) assembly, comprising:
   a first printed circuit board (PCB) having a first face and an opposing second face;
   a die electrically coupled to the first face of the first PCB;
   a second PCB having a first face, an opposing second face, a first side, and a second side opposite the first side, wherein the second face of the second PCB is coupled to the first face of the first PCB via one or more solder joints; and
   molding compound, wherein the molding compound is in contact with the first face of the first PCB, the second face of the second PCB, and one of the first or second sides of the second PCB, wherein another one of the first or second sides of the second PCB is free from contact with the molding compound.

2. The IC assembly of claim 1, wherein the die is an application specific integrated circuit (ASIC).

3. The IC assembly of claim 1, wherein a distance between the second face of the first PCB and the first face of the second PCB is less than 1 millimeter.

4. The IC assembly of claim 1, wherein the first PCB has a length in a first direction and the second PCB has a length in the first direction that is less than the length of the first PCB.

5. The IC assembly of claim 1, wherein the molding compound contacts the die.

6. The IC assembly of claim 1, wherein the first face of the second PCB comprises a plurality of conductive contacts.

7. The IC assembly of claim 1, wherein the molding compound does not contact the die.

8. The IC assembly of claim 7, wherein the die is flip-chip mounted to the first face of the first PCB.

9. The IC assembly of claim 1, further comprising:
   one or more IC packages surface mounted to the second face of the first PCB.

10. The IC assembly of claim 1, wherein the die is electrically coupled to the first face of the first PCB via one or more wire bonds.

11. The IC assembly of claim 1, wherein the solder joints are covered by the molding compound.

12. The IC assembly of claim 1, wherein the IC assembly comprises an edge finger connector, and wherein the edge finger connector includes conductive contacts on the second face of the first PCB.

13. The IC assembly of claim 12, wherein the edge finger connector includes conductive contacts on the first face of the second PCB.

14. The IC assembly of claim 1, wherein the IC assembly is a solid state drive.

15. The IC assembly of claim 1, wherein a width of the IC assembly is approximately 22 millimeters.

16. The IC assembly of claim 15, wherein a length of the IC assembly is approximately 42 millimeters.

17. An integrated circuit (IC) assembly, comprising:
    a printed circuit board (PCB) having a first face and an opposing second face;
    a die electrically coupled to the first face of the PCB;
    molding compound having a first face and an opposing second face, wherein the second face of the molding compound is in contact with the first face of the PCB and the die is contacted by the molding compound; and
    one or more through mold solder joints, extending from the first face of the PCB, through the molding compound, and beyond the second face of the molding compound, to couple the PCB with another PCB, wherein the other PCB is to have a first face, an opposing second face, a first side, and a second side opposite the first side, wherein the second face of the other PCB is to be coupled to the first face of the first PCB via one or more solder joints, wherein the molding compound is to be in contact with one of the first or second sides of the other PCB, wherein another one of the first or second sides of the other PCB is to be free from contact with the molding compound.

18. The IC assembly of claim 17, wherein:
    the IC assembly has a first face and an opposing second face;
    the second face of the IC assembly includes the second face of the PCB; and
    one or more IC packages are surface mounted to the second face of the PCB.

19. The IC assembly of claim 18, wherein the one or more IC packages are not surrounded by a molding compound.

20. The IC assembly of claim 17, wherein the other PCB comprises a motherboard, wherein the through mold solder joints are to be coupled to the motherboard such that the die is to be disposed between the PCB and the motherboard.

\* \* \* \* \*